United States Patent [19]

Marshall et al.

[11] Patent Number: 4,605,915

[45] Date of Patent: Aug. 12, 1986

[54] STRIPLINE CIRCUITS ISOLATED BY ADJACENT DECOUPLING STRIP PORTIONS

[75] Inventors: Henry D. Marshall, Ramona; Jeffrey K. Iida, La Jolla; Douglas J. Crow, Santee; Lawrence O. Friend, San Diego, all of Calif.

[73] Assignee: Cubic Corporation, San Diego, Calif.

[21] Appl. No.: 629,121

[22] Filed: Jul. 9, 1984

[51] Int. Cl.⁴ ............................................. H01P 3/08
[52] U.S. Cl. ............................ 333/238; 174/117 FF; 174/117 PC; 174/36
[58] Field of Search ............... 333/238, 246, 161, 128, 333/116, 1; 174/117 R, 117 F, 117 FF, 117 PC, 117 AS, 68.5, 36

[56] References Cited

U.S. PATENT DOCUMENTS

| | | | |
|---|---|---|---|
| 2,812,501 | 3/1954 | Sommers | 333/246 |
| 2,877,429 | 10/1955 | Sommers et al. | 333/24 R |
| 2,922,968 | 7/1957 | Van Patten | 333/204 |
| 2,926,317 | 3/1954 | Blitz | 333/238 |
| 3,093,805 | 6/1963 | Osifchin et al. | 333/238 X |
| 3,135,935 | 10/1962 | Engelbrecht | 333/238 |
| 3,255,426 | 16/1964 | Butler | 333/238 |
| 3,303,439 | 6/1965 | Fulp | 333/238 |
| 3,398,232 | 8/1968 | Hoffman | 333/238 X |
| 3,533,023 | 9/1967 | Friend et al. | 333/238 |
| 3,588,757 | 6/1971 | Andrascek et al. | 333/204 |
| 4,130,822 | 12/1978 | Conroy | 343/700 MS |

FOREIGN PATENT DOCUMENTS

| | | | |
|---|---|---|---|
| 0158702 | 12/1980 | Japan | 333/116 |
| 0117401 | 9/1981 | Japan | 333/116 |

Primary Examiner—Eugene R. LaRoche
Assistant Examiner—Benny T. Lee
Attorney, Agent, or Firm—Brown, Martin & Haller

[57] ABSTRACT

An electromagnetically-decoupled stripline circuit on a conventional circuitboard includes a center groundplane and two coplanar striplines that are sandwiched within a dielectric material between two outer groundplanes. A plurality of connectors conductively interconnect the groundplanes. The center groundplane has a decoupling strip portion lying between the striplines that is split in two by a gap. The gap traverses the direction an electromagnetic field would propagate from one of the striplines toward the other, and a pair of the connectors are positioned to straddle the gap. Z-wires, plated-through holes, and additional gaps may be employed.

8 Claims, 6 Drawing Figures

STRIPLINE CIRCUITS ISOLATED BY ADJACENT DECOUPLING STRIP PORTIONS

BACKGROUND OF THE INVENTION

This invention relates to strip transmission lines, and pertains particularly to a stripline circuit having two electromagnetically-decoupled striplines.

Stripline transmission lines are employed at microwave frequencies or frequencies involved in conventional radar systems to guide RF (radio frequency) energy. They also may be used as resonant circuits, impedance matching or measuring devices, or as the basic structures for various components in integrated-circuit design, and they frequently employ a configuration comprising a strip conductor sandwiched within a dielectric between two conductive groundplanes.

Although advantageous for miniature and subminiature designs, striplines have a relative disadvantage compared to some other transmission lines, such as coaxial cable and wave guides, in that unshielded and fringing RF fields more easily couple signals to other adjacent circuits. That is, a current flowing in a stripline causes an electromagnetic field to propagate toward other adjacent circuits without the field being confined, as it is in coaxial cable and waveguide devices, such that unwanted coupling results.

Existing stripline circuitboards employ various isolation techniques to combat this problem. For example, parallel outer groundplanes are often employed, with the stripline sandwiched within a dielectric between the outer groundplanes. This serves to confine the field. A center groundplane may be included in the plane of the stripline circuits, with the center groundplane and outer groundplanes being interconnected by plated-through holes or by Z-wires (wires bent in the general shape of the letter "Z"). This further confines the field. In addition, individual circuits are often carefully positioned relative to one another and to the center groundplane in an empirical determination of optimum component placement, whereby the resulting field pattern minimizes coupling (the "cut and try" method).

However, these techniques suffer certain drawbacks. They are often uncertain, time consuming, and of only limited success in adequately decoupling adjacent circuits.

Therefore, it is desirable to have a stripline circuit with improved electromagnetic decoupling. It is desirable that the decoupled circuit lend itself to standard circuitboard fabrication techniques without introducing significant additional expense. Additionally, it would be handy to have a method of refining the circuit layout once a circuitboard is fabricated in order to fine tune the design for minimum coupling.

SUMMARY OF THE INVENTION

This invention provides a new and improved stripline circuit having superior electromagnetic decoupling.

An exemplary embodiment of the invention includes a stripline circuit on a conventional circuitboard. The circuitboard employs two coplanar striplines that are sandwiched within a dielectric material between two outer groundplanes.

A center groundplane is included on the circuitboard. It is sandwiched between the outer groundplanes in coplanar relation to the striplines, and a plurality of connectors conductively interconnect it with the outer groundplanes.

The center groundplane has a decoupling strip portion lying between the striplines. The decoupling strip includes a gap that splits the decoupling strip in two. The gap traverses the direction an electromagnetic field would propagate from one of the striplines to the other, and a pair of the connectors are positioned to straddle the gap.

This configuration confines the electromagnetic field and reduces unwanted coupling. Further, it may be tailored by the introduction of additional gaps and connectors to optimize a circuitboard design.

Other features and many attendant advantages of the invention will become more fully apparent upon a reading of the detailed description in conjunction with the drawings wherein like numerals refer to like components throughout.

DETAILED DESCRIPTION OF THE INVENTION

Figure 1:
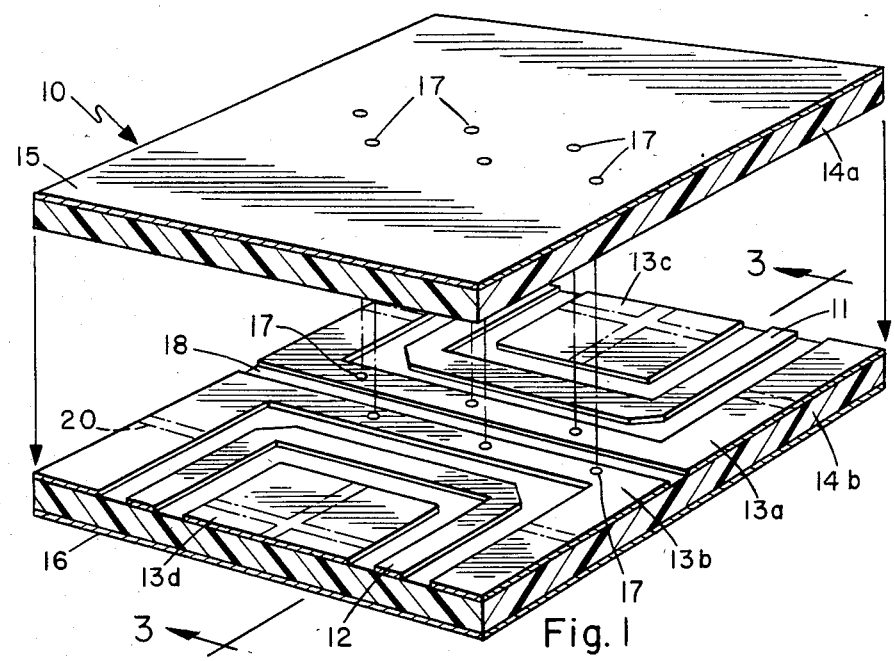
FIG. 1 is a perspective view of an exemplary embodiment of a stripline circuit constructed on a circuitboard in accordance with the invention, the upper and lower portions of the circuitboard being separated for illustrative purposes.

Turning now to FIG. 1 of the drawing, there is illustrated an exemplary embodiment of a stripline circuit constructed on a circuitboard in accordance with the invention. The circuitboard is referred to generally by reference numeral 10, and shown to include two generally coplanar striplines, stripline 11 and stripline 12, as well as a center groundplane in four electrically-separated sections, groundplane sections 13a, 13b, 13c, and 13d.

The striplines and center groundplane are substantially coplanar. They are sandwiched within a dielectric material between two outer groundplanes. In the configuration illustrated in FIG. 1, the circuitboard is separated into two halves to show the striplines and center groundplane within. The upper half includes upper dielectric material 14a and the lower half includes lower dielectric material 14b. This dielectric material extends between outer groundplane 15 and outer groundplane 16 as illustrated.

The upper half of the circuitboard is a typical one-sixteenth inch thick copper clad glass epoxy board with 0.00125 inch thick copper on one side (1 ounce per square foot). The copper serves as outer groundplane 15.

The lower half is a double-sided copper clad glass epoxy board of the same relative dimensions. One of the copper sheets serves as outer groundplane 16, and the other copper sheet is etched using known means to form the illustrated stripline and center groundplane configuration.

The two halves are bonded together using known means (such as a known dielectric adhesive) to form the completed circuitboard, and holes 17 are provided through the circuitboard at selected locations for use in conductively interconnecting the groundplanes with conductive connectors or plated-through holes.

The center groundplane includes a decoupling strip portion lying between the striplines. In the illustrated embodiment, the decoupling strip includes that portion of groundplane sections 13a and 13b that lies between the striplines. This decoupling strip portion has a gap that splits the decoupling strip in two, gap 18 in FIG. 1. The gap traverses the direction an electromagnetic field would propagate from one of the striplines to the other in causing unwanted coupling between the two striplines.

Circuitboard 10 includes a plurality of holes which extend through the circuitboard from outer groundplane 15 to outer groundplane 16. In particular, holes 17 extend through groundplane sections 13a and 13b and are staggered along the length and on opposite sides of gap 18. By conductively interconnecting the groundplanes through these holes with conductive connectors such as Z-wires or plated-through holes, center groundplane sections 13a and 13b are conductively interconnected with the outer groundplanes and an electromagnetic field eminating from either stripline is confined, with reduced intercoupling resulting.

Figure 2:
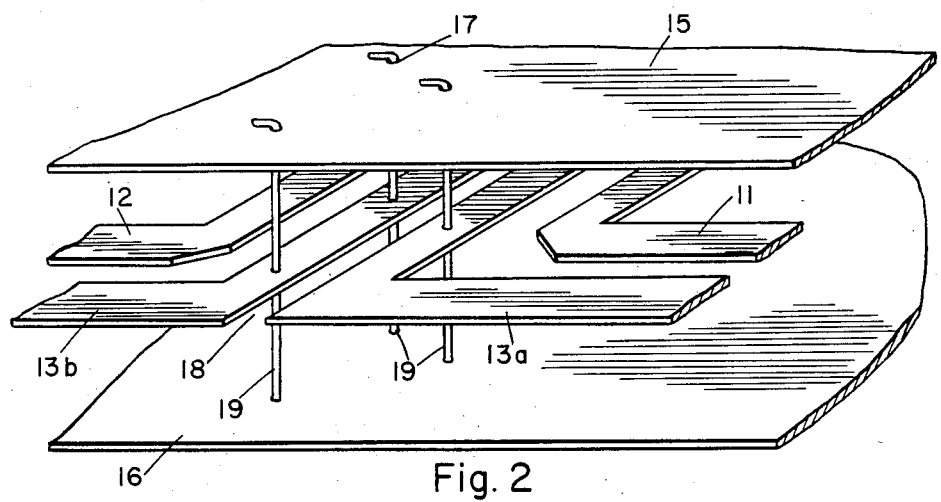
FIG. 2 illustrates the conductive connectors interconnecting the center groundplane and the outer groundplanes.

Further details of the stripline circuit are illustrated in FIG. 2 wherein the dielectric material is omitted for ease of illustration. Z-wires 19 are shown in place. Each Z-wire extends from outer groundplane 15 through the center groundplane (either section 13a or section 13b) to outer groundplane 16. The Z-wires are conductively connected to each of the groundplanes by suitable means such as soldering.

Figure 3:
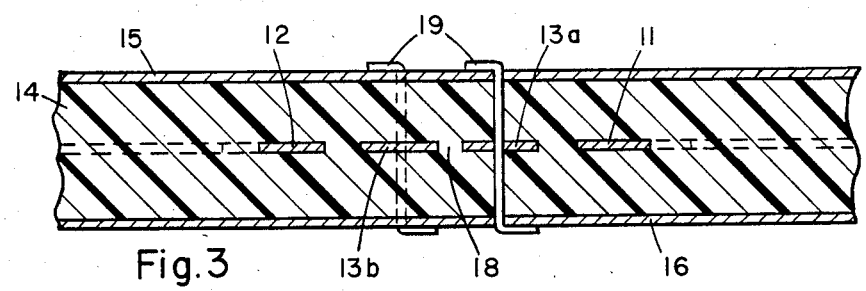
FIG. 3 is an enlarged sectional view taken on line 3—3 of FIG. 1, with the upper and lower portions joined.

The two halves of the circuitboard are illustrated bonded together in the enlarged sectional view of FIG. 3. For ease of illustration, the dielectric material is referred to by reference numeral 14 and shown extending continuously from outer groundplane 15 to outer groundplane 16, rather than as the two halves, 14a and 14b, shown in FIG. 1. As illustrated in FIG. 3, the decoupling strip portion, composed of groundplane sections 13a and 13b, lies between stripline 11 and stripline 12. The nonconductive gap in the decoupling strip portion, gap 18, lies between the striplines also, and it traverses the direction that an electromagnetic field would propagate from one of the striplines to the other. In this position the gap breaks up current loops induced in the decoupling strip portion. It also separates center groundplane section 13a from center groundplane section 13b so that these sections can, in combination with the connectors, effectively short the E-wave and H-wave components of an electromagnetic field propagated between the striplines.

Additional gaps and additional connectors may be employed. The phantom lines illustrated in FIG. 1 across the center groundplane segments illustrate the positioning of additional gaps to inhibit the flow of current in the center groundplane. A representative one is labeled with reference numeral 20. Additional connectors may be included on either side of each such gap. The connectors should be spaced along each gap at intervals of one-eighth wavelength or less at the highest frequency to be propagated in the stripline circuits. After once having designed a circuit in the manner described, it is possible to further fine tune the design by the introduction of additional gaps and connectors. Accordingly, an additional gap may be etched in the decoupling strip portion substantially parallel to gap 18, and additional holes 17 and connectors 19 may be added to empirically determine an optimum circuit design for decoupling given stripline circuits.

Thus, the outer groundplanes combine with the center groundplane, and the one or more gaps therein, and with the connectors to reduce unwanted electromagnetic coupling. And, additional gaps and connectors can be added to fine tune the design for minimum coupling.

Figure 4:
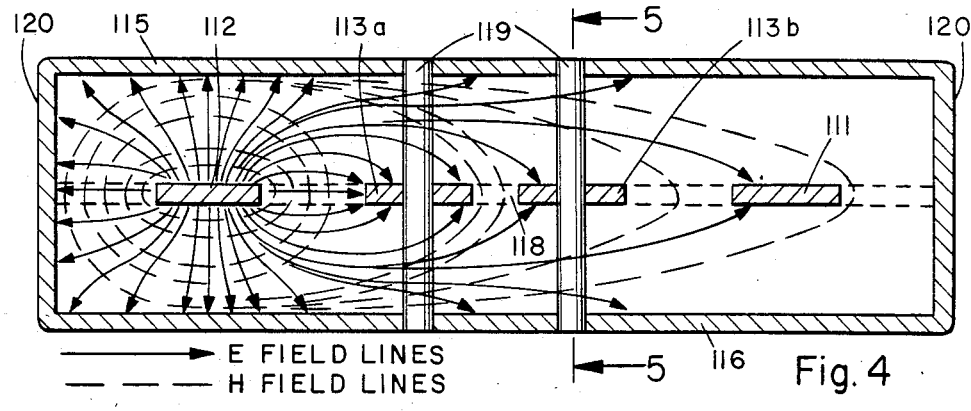
FIG. 4 is a sectional view of an alternate embodiment illustrating a typical electromagnetic field pattern within.

Turning now to FIG. 4, there is illustrated a typical electromagnetic field pattern within an alternate embodiment of the stripline circuitboard of this invention. Reference numerals are increased by 100 over those designating similar features in FIGS. 1-3.

The embodiment of FIG. 4 employs plated-through holes 119 to conductively interconnect the outer groundplanes 115 and 116 with groundplane sections 113a and 113b of the center groundplane. Nonconductive gap 118 similarly separates groundplane sections 113a and 113b as did gap 18 for groundplane sections 13a and 13b in FIGS. 1-3. The embodiment of FIG. 4 also includes the illustrated outer groundplane sections 120 plated on the exterior of the circuitboard between outer groundplanes 115 and 116 to help confine the electromagnetic field within.

The electromagnetic field is illustrated using solid lines with arrowheads to represent the E-field component and dashed lines to represent the H-field component. The $TE_{01}$ mode of propagation from stripline 112 to stripline 111 is shown. Higher order modes of propagation are significantly suppressed by the geometry of the circuitboard and the mode suppression effect of the plated-through holes.

Coupling between the striplines by the $TE_{01}$ mode is reduced by the E-field being coupled to groundplane sections 113a and 113b as well as the outer groundplanes, and by the H-field being restricted by the shorted turns produced by the combination of the plated-through holes, the center groundplane sections, and the outer groundplanes.

Figure 5:
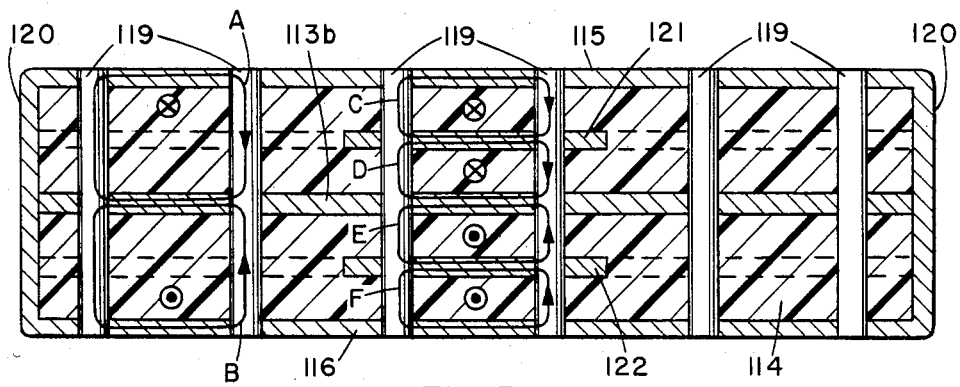
FIG. 5 is a sectional view taken on line 5—5 of FIG. 4 illustrating typical current loops and showing additional internal groundplanes for increased decoupling.

The mechanism by which the H-field is restricted is further shown in FIG. 5 which is a sectional view of the embodiment of FIG. 4 taken on line 5—5 of FIG. 4. It illustrates typical current loops as well as additional decoupling strips 121 and 122.

One of the current loops is designated with reference letter A. It is shown encircling a circle with a cross in it that represents a H-field line normal to and directed into the plane of the drawing. Associated with current loop A is current loop B in which is shown a circle with a dot in it to represent a H-field line normal to and directed out of the plane of the drawing. These current loops flow through the decoupling strip portion of the center groundplane, the plated-through holes, and the outer groundplanes as illustrated. As H-field lines pass through the loops, they induce currents to flow in the loops which counteract the H-field propagation. Thus, they serve to restrict H-field coupling between the striplines.

Additional current loops may be produced by including additional decoupling strips 121 and 122 as illustrated in dashed lines in FIG. 5, decoupling strip 121 lying between the center groundplane and outer groundplane 115, and decoupling strip 122 lying between the center groundplane and outer groundplane 116. These additional decoupling strips are interconnected with the center groundplane and the outer groundplanes by the plated-through holes as illustrated in FIG. 5, with current loops C, D, E, and F resulting to restrict the H-field lines encircled by those current loops, the H-field lines being represented using the same convention of circles with crosses or dots within them.

Such additional decoupling strips also further reduce E-field coupling by introducing greater capacitive shunting of the E-field lines by the increased distributed capacitance between the decoupling strip portions and the outer groundplanes.

Figure 6:
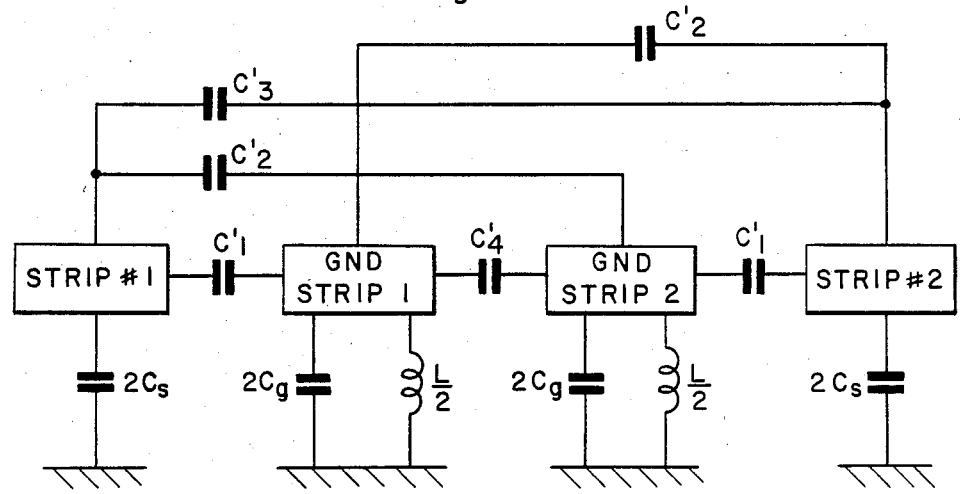
FIG. 6 is a lumped-element equivalent circuit for the E-field within the embodiment of FIG. 4.

FIG. 6 illustrates an E-field equivalent circuit for the embodiment of FIG. 4 which shows the effect of additional gaps and connectors. The distributed capacitance and inductance in the embodiment of FIG. 4 is shown as lumped circuit elements in FIG. 6. Stripline 112 is designated STRIP #1, and stripline 111 is designated STRIP #2. Groundplane section 113a is designated GND STRIP 1, and center groundplane section 113b is designated GND STRIP 2.

All capacitance and inductance values illustrated in the equivalent circuit of FIG. 6 are a function of the geometry of the circuitboard and the dielectric constant of the dielectric material employed. Since the geometry of the embodiment of FIG. 4 is generally symmetrical in the placement and size of the striplines and center groundplane sections, the values of distributed capacitance and inductance can be approximated as shown in FIG. 6.

Accordingly, a capacitor designated "$2C_s$" is shown between STRIP #1 and ground as the lumped equivalent of distributed capacitance between stripline 112 and the outer groundplanes, and a capacitor "$2C_s$" is shown connected between STRIP #2 and ground as the equivalent of the distributed capacitance between stripline 111 and the outer groundplanes. Also, a capacitor "$2C_g$" is shown connected between GND STRIP 1 and ground as the equivalent of the distributed capacitance between groundplane section 113a and the outer groundplanes, and a capacitor "$2C_g$" is shown connected between GND STRIP 2 and ground as the equivalent of the distributed capacitance between groundplane section 113b and the outer groundplanes.

Similarly, a capacitor "$C'_1$" is shown in FIG. 6 connected between STRIP #1 and GND STRIP 1 as the equivalent of the distributed capacitance between stripline 112 and groundplane section 113a, and a capacitor "$C'_1$" is shown connected between STRIP #2 and GND STRIP 2 as the equivalent of the distributed capacitance between stripline 111 and groundplane section 113b.

In the same manner, capacitor "$C'_2$" is shown in FIG. 6 connected between STRIP #1 and GND STRIP 2, and a capacitor "$C'_2$" of the same approximate value is shown connected between STRIP #2 and GND STRIP 1 as the equivalent of the distributed capacitance between the corresponding striplines and groundplane sections.

The capacitor "$C'_3$" between STRIP #1 and STRIP #2 in FIG. 6 represents the equivalent of the distributed capacitance between striplines 112 and 111, and capacitor "$C'_4$" shown connected between GND STRIP 1 and GND STRIP 2 in FIG. 6 represents the distributed capacitance between groundplane section 113a and 113b.

An inductance "$L/2$" is shown connected between GND STRIP 1 and ground and an inductance of the same approximate value is shown connected between GND STRIP 2 and ground to represent the inductive values of the plated-through holes interconnecting the groundplane sections 113a and 113b with the outer groundplanes 115 and 116.

The equivalent circuit illustrates the decoupling effect of the groundplane sections 113a and 113b. These sections are coupled to the outer groundplanes by both the plated-through holes as represented by the inductance values in FIG. 6 and by distributed capacitance between the groundplane sections and the outer groundplanes as represented by the capacitors "$2C_g$". Additional gaps and connectors would add additional sections of "$C'_4$" and "$2C_g$" as well as additional "$L/2$" sections to thereby further reduce E-M coupling between the striplines.

Thus, the center groundplane sections, with a gap between them and plated-through holes interconnecting them with the outer groundplanes, combine to provide superior electromagnetic decoupling of the striplines.

As various changes may be made in the form, construction, and arrangement of the parts herein, without departing from the spirit and scope of the invention and without sacrificing any of its advantages, it is to be understood that all matter herein is to be interpreted as illustrative and not in any limiting sense.

What is claimed is:

1. An isolated stripline circuitboard for electromagnetically isolating adjacent striplines disposed therein, comprising:

a pair of substantially parallel outer groundplanes;

a dielectric material sandwiched between said pair of outer groundplanes;

at least two substantially coplanar striplines disposed within said dielectric material in substantially parallel relation to said outer groundplanes;

a center groundplane disposed within said dielectric material adjacent and coplanar to said striplines, said center groundplane having at least one decoupling strip portion, each decoupling strip portion positioned between adjacent striplines wherein each decoupling strip portion includes a nonconductive gap within the decoupling strip portion;

at least one pair of additional decoupling strips disposed within said dielectric material, one of the additional decoupling strips of said additional decoupling strip pair positioned adjacent one of said decoupling strip portions and between said one of said decoupling strip portions and one of said outer groundplanes, the other of the additional decoupling strips of said additional decoupling strip pair positioned adjacent said one of said decoupling strip portions and between said one of said decoupling strip portions and the other of said outer groundplanes wherein each additional decoupling strip includes a nonconductive gap within the additional decoupling strip;

a plurality of conductive connectors extending from one of said outer groundplanes through said dielectric material, through said center groundplane, and through each pair of additional decoupling strips to the other of said outer groundplanes, for electrically interconnecting said outer groundplanes to said center groundplane and each one of said pair of additional decoupling strips, certain ones of said conductive connectors extending through at least one of said decoupling strip portions and at least one of said additional decoupling strips at predetermined spaced apart intervals adjacent a respective nonconductive gap; and wherein said outer groundplanes, said certain ones of said conductive connectors, each of said decoupling strip portions and each of said pair of additional decoupling strips permit current loops to flow therethrough when a current is flowing through at least one of said adjacent striplines so as to substantially reduce E-field and H-field coupling between adjacent coplanar striplines.

2. The circuitboard of claim 1 wherein said center groundplane includes at least one additional nonconductive gap in selected portions of said center groundplane.

3. The circuitboard of claim 1 wherein said connectors are comprised of plated-through holes mounted in electrical connection to said center groundplane and said outer groundplanes.

4. The circuitboard of claim 1 wherein said connectors are comprised of Z-shaped wires mounted within holes formed through said circuitboard, said Z-shaped wires mounted in electrical connection with said center groundplane and said outer groundplanes.

5. A circuitboard assembly for electromagnetically isolating adjacent stripline circuits disposed therein, comprising:

a pair of substantially parallel outer groundplanes;

a dielectric material sandwiched between said pair of outer groundplanes;

a center groundplane disposed within said dielectric material parallel to said outer groundplanes, said center groundplane having at least one decoupling strip portion, each decoupling strip portion positioned adjacent and between adjacent stripline circuits disposed coplanar to said center groundplane wherein each decoupling strip portion includes a nonconductive gap within the decoupling strip portion;

at least one pair of additional decoupling strips disposed within said dielectric material, one of the additional decoupling strips of said additional decoupling strip pair positioned adjacent one of said decoupling strip portions and between said one of said decoupling strip portions and one of said outer groundplanes, the other of the additional decoupling strips of said additional decoupling strip pair positioned adjacent said one of said decoupling strip portions and between said one of said decoupling strip portions and the other of said outer groundplanes wherein each additional decoupling strip includes a nonconductive gap within the additional decoupling strip;

a plurality of conductive connectors extending from one of said outer groundplanes through said dielectric material, through said center groundplane, and through each pair of additional decoupling strips to the other of said outer groundplanes, for electrically interconnecting said outer groundplanes to said center groundplane and each one of said pair of additional decoupling strips, certain ones of said conductive connectors extending through at least one of said decoupling strip portions and at least one of said additional decoupling strips at predetermined spaced apart intervals adjacent a respective nonconductive gap; and wherein said outer groundplanes, said certain ones of said conductive connectors, each of said decoupling strip portions and each of said pair of additional decoupling strips permit current loops to flow therethrough when a current is flowing through at least one stripline circuit so as to substantially reduce E-field and H-field coupling between an adjacent coplanar stripline circuit.

6. The circuitboard of claim 5 wherein said center groundplane includes at least one additional nonconductive gap in selected portions of said center groundplane.

7. The circuitboard of claim 5 wherein said connectors are comprised of plated-through holes mounted in electrical connection to said center groundplane, said additional decoupling strips and said outer groundplanes.

8. The circuitboard of claim 5 wherein said connectors are comprised of z-shaped wires mounted in electrical connection with said center groundplane, said additional decoupling strips and said outer groundplanes.

* * * * *